(12) United States Patent
Oshida

(10) Patent No.: US 8,426,975 B2
(45) Date of Patent: Apr. 23, 2013

(54) SEMICONDUCTOR DEVICE HAVING WIRING LAYER WITH A WIDE WIRING AND FINE WIRINGS

(75) Inventor: Daisuke Oshida, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/561,752

(22) Filed: Jul. 30, 2012

(65) Prior Publication Data
US 2012/0292765 A1 Nov. 22, 2012

Related U.S. Application Data

(62) Division of application No. 12/474,526, filed on May 29, 2009, now Pat. No. 8,299,621.

(30) Foreign Application Priority Data
Jun. 3, 2008 (JP) .................................. 2008-145372

(51) Int. Cl.
*H01L 23/48* (2006.01)
*H01L 23/52* (2006.01)
*H01L 29/40* (2006.01)

(52) U.S. Cl.
USPC ....................... 257/773; 257/775; 257/E23.01

(58) Field of Classification Search .................. 257/773, 257/775, E23.01
See application file for complete search history.

(56) References Cited

U.S. PATENT DOCUMENTS

| | | | |
|---|---|---|---|
| 6,445,055 B2 * | 9/2002 | Iwasakii et al. | 257/507 |
| 6,624,514 B2 | 9/2003 | Kasai | |
| 6,867,136 B2 * | 3/2005 | Basol et al. | 438/687 |
| 6,989,603 B2 | 1/2006 | Zhang | |
| 7,042,095 B2 | 5/2006 | Noguchi et al. | |
| 7,067,919 B2 | 6/2006 | Watanabe et al. | |
| 7,268,434 B2 | 9/2007 | Nakashima | |
| 2002/0163086 A1 | 11/2002 | Toyoda | |
| 2003/0116852 A1 * | 6/2003 | Watanabe et al. | 257/758 |
| 2003/0146516 A1 | 8/2003 | Amishiro et al. | |
| 2003/0189254 A1 | 10/2003 | Yew et al. | |
| 2007/0161239 A1 | 7/2007 | Murray et al. | |
| 2008/0122089 A1 | 5/2008 | Iijima | |
| 2009/0283797 A1 * | 11/2009 | Takahashi et al. | 257/139 |
| 2010/0214833 A1 * | 8/2010 | Takemura et al. | 365/163 |
| 2010/0237407 A1 * | 9/2010 | Nojima | 257/329 |
| 2010/0285651 A1 * | 11/2010 | Kuroi et al. | 438/296 |
| 2012/0119326 A1 * | 5/2012 | Sugisaki et al. | 257/532 |
| 2012/0199805 A1 * | 8/2012 | Sorada et al. | 257/2 |

FOREIGN PATENT DOCUMENTS

| JP | 2004-193544 | 7/2004 |
|---|---|---|
| JP | 2006-165091 | 6/2006 |

* cited by examiner

*Primary Examiner* — Teresa M Arroyo
(74) *Attorney, Agent, or Firm* — Young & Thompson

(57) ABSTRACT

Provided is a semiconductor device having a wiring layer formed of damascene wiring. The semiconductor device includes: a first wiring having a width equal to or larger than 0.5 μm; a second wiring adjacent to the first wiring and arranged with a space less than 0.5 μm from the first wiring; and a third wiring adjacent to the second wiring and arranged with a space equal to or smaller than 0.5 μm from the first wiring. In the semiconductor device, the second wiring and the third wiring are structured to have the same electric potential.

15 Claims, 6 Drawing Sheets

DIFFERENT ELECTRIC POTENTIALS

SEMICONDUCTOR DEVICE HAVING WIRING LAYER WITH A WIDE WIRING AND FINE WIRINGS

CROSS REFERENCE TO RELATED APPLICATIONS

This application is a division of co-pending application Ser. No. 12/474,526 filed on May 29, 2009, which claims foreign priority to Japanese Application No. 2008-145372 filed on Jun. 3, 2008. The entire content of each of these applications is hereby expressly incorporated by reference.

BACKGROUND OF THE INVENTION

1. Field of the Invention

The present invention relates to a semiconductor device, and more particularly, to a semiconductor device including a wiring layer formed of damascene wiring.

2. Description of the Related Art

FIG. 9 is a plan view of a wiring layer in a semiconductor device including conventional damascene wiring. FIG. 10 is a sectional view taken along the line B-B' of FIG. 9. A semiconductor device 100 is provided with a wiring layer including a wide wiring 102, and fine wirings 104 and 106 adjacent to each other, in an interlayer insulating film 108 formed on a semiconductor substrate (not shown). Different electric potentials are generally imparted to the fine wirings 104 and 106 adjacent to each other. The wide wiring and the fine wirings are formed by a damascene process. In general, the damascene process requires a surface planarization step of chemical mechanical polishing (CMP) as an essential step. Note that the semiconductor device 100 generally has a multilayer wiring layer, but FIGS. 9 and 10 illustrate a single wiring layer included in the multilayer wiring layer.

In the semiconductor device 100 with the structure as described above, a problem that has not existed in the past arises along with a progress of the miniaturization in recent semiconductor integrated circuits.

In a wiring layout as illustrated in FIG. 9, a distance D and a wiring pitch P between the fine wirings have been made smaller along with the progress of the miniaturization in the recent semiconductor integrated circuits. As a result, there arises a problem that a time-dependent dielectric breakdown (TDDB) lifetime between the fine wirings 104 and 106 adjacent to each other is reduced, or that the fine wirings 104 and 106 adjacent to each other are short-circuited to thereby reduce a yield of the semiconductor device.

JP 2006-165091 A discloses a structure in which a wiring space in a case where a wide wiring and a fine wiring have different electric potentials is secured so as to be larger than a wring space in a case where the wide wiring and the fine wiring have the same electric potential, in a semiconductor device having a wiring layout of the wide wiring and the fine wiring which are adjacent to each other. With this structure, it is assumed that an integration level of a wiring pattern in a semiconductor integrated device can be increased.

SUMMARY OF THE INVENTION

The present invention has an object to provide a semiconductor device having a wiring layer formed of damascene wiring. In the wiring layer containing fine wirings adjacent to each other and a wide wiring adjacent to the fine wirings, a reduction of a time-dependent dielectric breakdown (TDDB) lifetime between the fine wirings and a yield reduction due to a short-circuit between the fine wirings are suppressed.

As a result of intensive studies, the inventor of the present invention has found that the above-mentioned problem is attributed to the fact that, in a chemical mechanical polishing (CMP) step required for damascene wiring as an essential step, conductive foreign substances which are generated from the wide wiring and formed of a metal organic residue adhere to a surface of the wiring layer (FIG. 7). Further, the inventor of the present invention has achieved the present invention based on the findings by various pieces of experimental data in the CMP step.

A semiconductor device including a wiring layer formed of damascene wiring, according to the present invention includes: a first wiring having a width equal to or larger than 0.5 µm; a second wiring adjacent to the first wiring and arranged with a space less than 0.5 µm from the first wiring; and a third wiring adjacent to the second wiring and arranged with a space equal to or smaller than 0.5 µm from the first wiring, in which the second wiring and the third wiring are structured to have the same electric potential.

With such a structure, the second wiring and the third wiring have the same electric potential. Accordingly, even when the conductive foreign substances adhere to the surface of the wiring layer, the reduction of the TDDB lifetime between the wirings, and the yield reduction due to short-circuit between the wirings can be suppressed.

According to the present invention, the semiconductor device including the wiring layer formed of damascene wiring is provided. In the wiring layer containing the fine wirings adjacent to each other, and the wide wiring adjacent to the fine wirings, the reduction of the TDDB lifetime between the fine wirings and the yield reduction due to the short-circuit between the fine wirings are suppressed.

DETAILED DESCRIPTION OF THE PREFERRED EMBODIMENT

Figure 1:
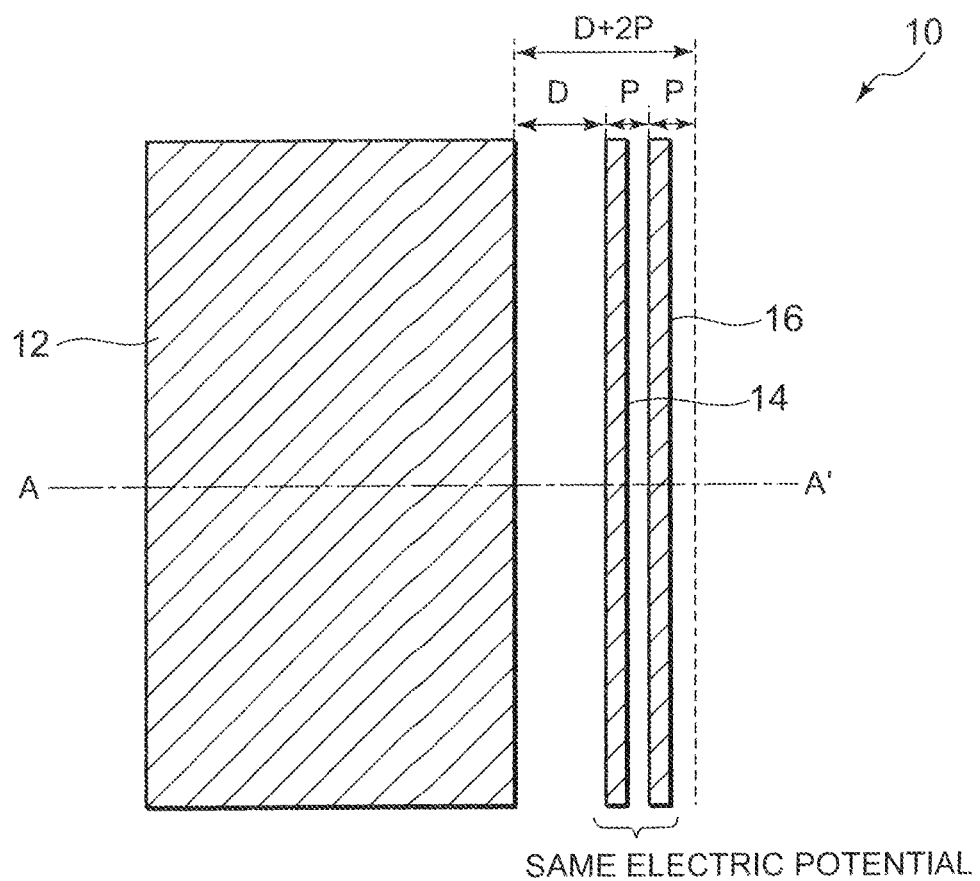
FIG. 1 is a plan view illustrating a semiconductor device according to an embodiment of the present invention.

Hereinafter, a suitable embodiment of the present invention is described in detail with reference to the drawings. Note that, for description of the respective drawings, the same components are denoted by the same reference numerals, and overlapping descriptions thereof are omitted.

Figure 2:
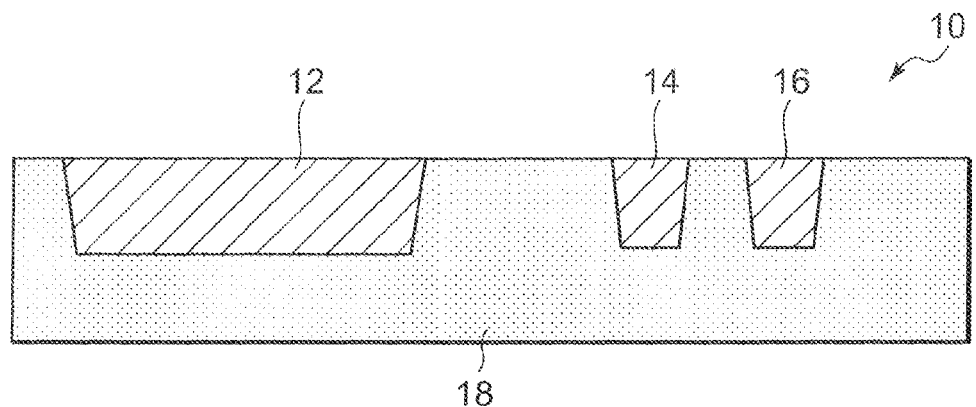
FIG. 2 is a sectional view taken along the line A-A' of FIG. 1.

FIG. 1 is a plan view illustrating a structure of a semiconductor device of this embodiment. FIG. 2 is a sectional view taken along the line A-A' of FIG. 1.

A semiconductor device 10 includes an interlayer insulating film 18 formed on a semiconductor substrate (not shown), and wirings 12, 14, and 16 formed in the interlayer insulating film 18. The wirings 12, 14, and 16 are provided in the same wiring layer. In this embodiment, the wirings 12, 14, and 16 are formed of Cu. The wiring 12 (first wiring) is a wide wiring having a width equal to or larger than 0.5 µm.

The wiring 14 (second wiring) and the wiring 16 (third wiring) are fine wirings. The wiring 14 is adjacent to the wiring 12 and arranged with a space less than 0.5 µm away from the wiring 12. Further, the wiring 16 is adjacent to the wiring 14 and arranged with a space equal to or smaller than 0.5 µm away from the wiring 12.

In this embodiment, the wiring 12 and the wiring 14 are arranged with a space of 0.3 µm therebetween. Further, a width of the wiring 14 and a width of the wiring 16 are each set to 0.07 µm, and a wiring space therebetween is set to 0.07 µm, that is, a wiring pitch therebetween is set to 0.14 µm. Here, the wiring pitch is defined by the sum of the wiring width and the wiring space. Further, the wiring 14 and the wiring 16 may be formed at a minimum pitch, for example.

In addition, the wiring 14 and the wiring 16 are formed so as to have the same electric potential. For example, the wiring 14 and the wiring 16 may be formed so as to both have a ground potential. In this case, the wiring 14 and the wiring 16 are connected to a common ground wiring (not shown). Similarly, the wiring 14 and the wiring 16 may be formed so as to both have a power supply potential. In this case, the wiring 14 and the wiring 16 are connected to a common power supply wiring (not shown).

Note that, in the subject specification, the wording "have the same electric potential" does not contain an electric potential difference generated by a voltage drop due to wiring resistance. Specifically, if the wiring 14 and the wiring 16 are connected to a common power supply wiring, the effect of the present invention can be sufficiently obtained even when the electric potential difference is generated between the wirings by the voltage drop due to the wiring resistance, under such a condition that the electric potential difference is equal to or smaller than 30% of a power supply voltage, and preferably equal to or smaller than 10% of the power supply voltage. For example, in a case where the power supply voltage is 1 V, the effect of the present invention can be sufficiently obtained with the electric potential difference equal to or smaller than 0.3 V, and preferably equal to or smaller than 0.1 V.

Next, with reference to FIGS. 3A and 3B, 4A and 4B, 5A and 5B, and 6A and 6B, a manufacturing method for the semiconductor device 10 is described together with the description of a mechanism in which a metal (Cu in this embodiment) organic residue adheres to the surface of the wiring layer.

Figure 3A:
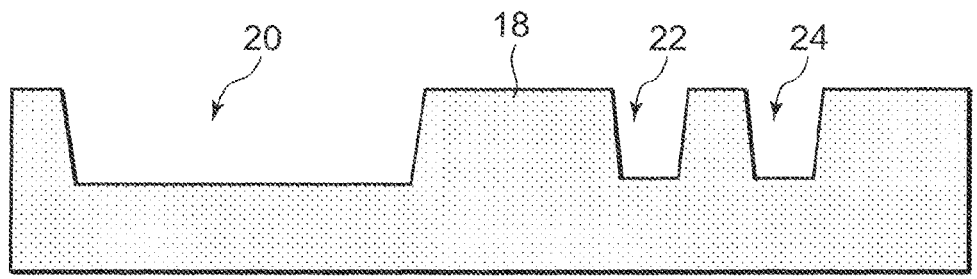
FIGS. 3A and 3B are sectional views illustrating steps of a manufacturing method for the semiconductor device according to the present invention.

First, as illustrated in FIG. 3A, the interlayer insulating film 18 is formed on the semiconductor substrate (not shown) by a known technology, and wiring grooves 20, 22, and 24 are formed in the interlayer insulating film 18. As the interlayer insulating film 18, for example, an $SiO_2$ film or a low-k film may be used.

Figure 3B:
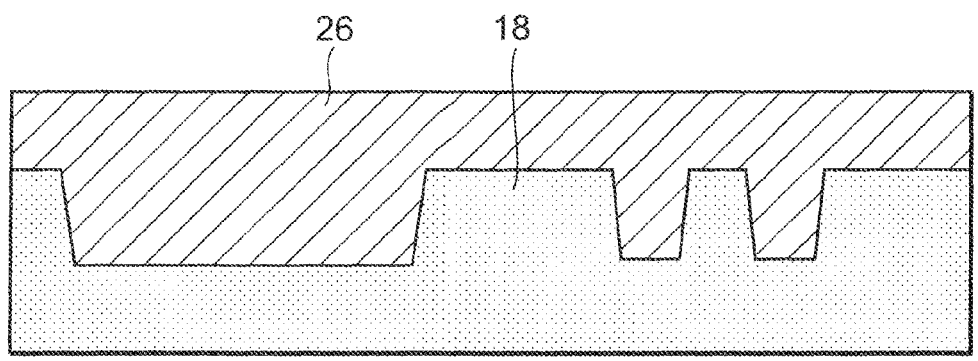

Then, a barrier film (not shown) is formed by sputtering. Ta/TaN may be used for the barrier film. Next, a Cu seed layer (not shown) is formed by sputtering, and thereafter a Cu film is deposited by plating, and then annealing for crystallization is performed (FIG. 3B).

Subsequently, a chemical mechanical polishing (CMP) step is performed. In this step, the Cu film and the barrier film are removed by CMP to form a Cu wiring, whereby the structure illustrated in FIG. 2 is formed. After that, for example, an SiN film is formed as a cap layer for preventing diffusion, and an interlayer insulating film for forming an upper wiring layer is formed on the cap layer. Then, a via hole is formed in the interlayer insulating film, and a via is formed by a similar method used for the above-mentioned wiring layer. Hereinafter, the steps described above are repeated to form a multilayer wiring structure formed of damascene wiring.

Here, the CMP step of the subject specification includes a polishing step of the Cu film and the barrier film, a cleaning step, an antioxidant film forming step, and a drying step. FIGS. 4A and 4B to FIGS. 6A and 6B are sectional views illustrating detailed steps included in the CMP step, in which a generation mechanism of foreign substances formed of an organic residue, which has been newly found by the inventor of the present invention, is illustrated.

Figure 4A:
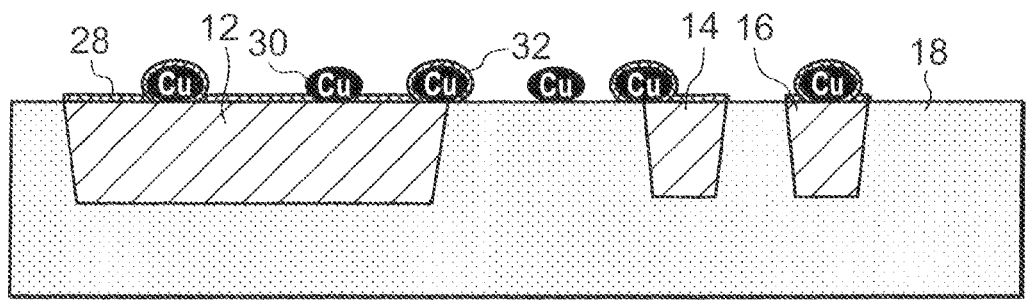
FIGS. 4A and 4B are sectional views illustrating steps of the manufacturing method for the semiconductor device according to the present invention.

FIG. 4A is a sectional view of the semiconductor device 10 at a stage at which the steps up to the polishing of the barrier film have been finished. Cu (or Cu ion) 30 which is generated by polishing the wiring 12 of a wide wiring adheres to the surface of the wiring layer. Further, a polishing agent used to polish the Cu film and the barrier film by CMP contains an antioxidant. The antioxidant forms a film 28 on a surface of the Cu wiring to prevent oxidation of Cu. Further, an organic residue contained in the antioxidant bonds to part of Cu which adheres to the surface of the Cu wiring, to thereby form a complex 32 containing Cu and the organic residue.

Figure 4B:
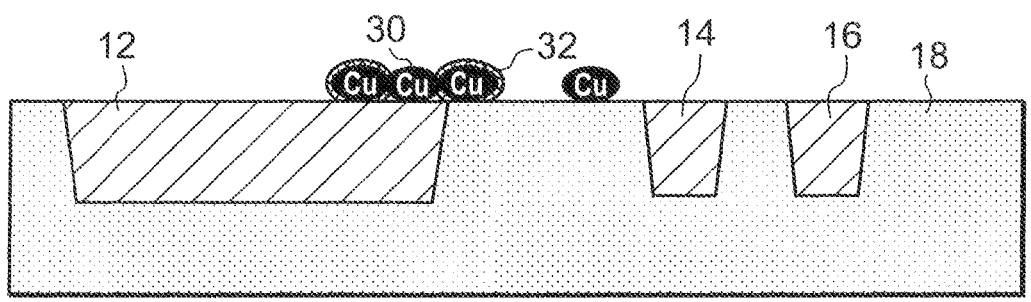

Then, a surface of the wiring layer is polished through immersion of ultrapure water. Through this step, as illustrated in FIG. 4B, the complex 32 which contains Cu and the organic residue and the Cu 30 which does not form a complex are agglomerated to become a huge foreign substance. This foreign substance has a size which can be detected with an automatic visual inspection device used in a general inspection step for semiconductor devices.

Figure 5A:
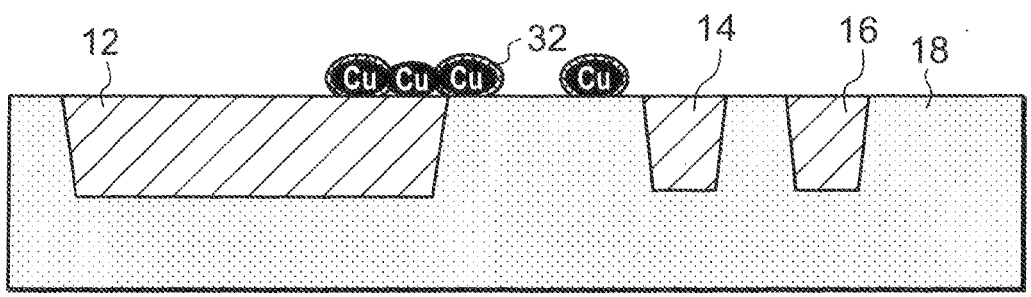
FIGS. 5A and 5B are sectional views illustrating steps of the manufacturing method for the semiconductor device according to the present invention.

Next, as illustrated in FIG. 5A, a first cleaning step is performed. The object of the first cleaning step is to remove large impurities remaining after the polishing. This cleaning step can be performed by using, for example, a chelator or a reducing agent. Though this step, as illustrated in FIG. 5A, the Cu which has not formed a complex forms the complex 32 containing Cu and the organic residue.

Figure 5B:
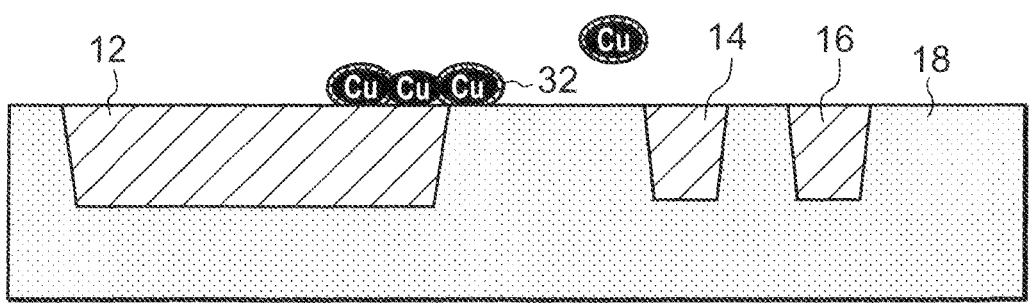

Then, a second cleaning step is performed as illustrated in FIG. 5B. The object of this cleaning step is to remove, for example, extremely small ionic impurities or metal which remain after the polishing. This cleaning step can be performed by using, for example, a chelator or a reducing agent. Though this step, as illustrated in FIG. 5B, part of the complex containing Cu and the organic substrate is removed from the surface of the wiring layer. However, the complex is not completely removed. The complex 32 containing Cu and the organic residue remains on the wiring 12 which is a wide wiring, and in the vicinity thereof.

Figure 6A:
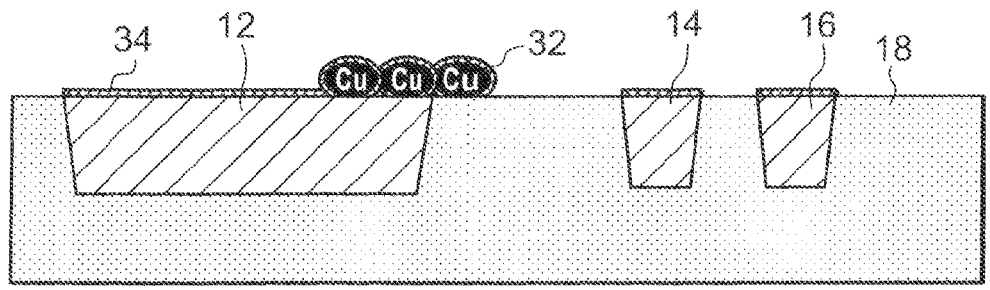
FIGS. 6A and 6B are sectional views illustrating steps of the manufacturing method for the semiconductor device according to the present invention.
Figure 6B:
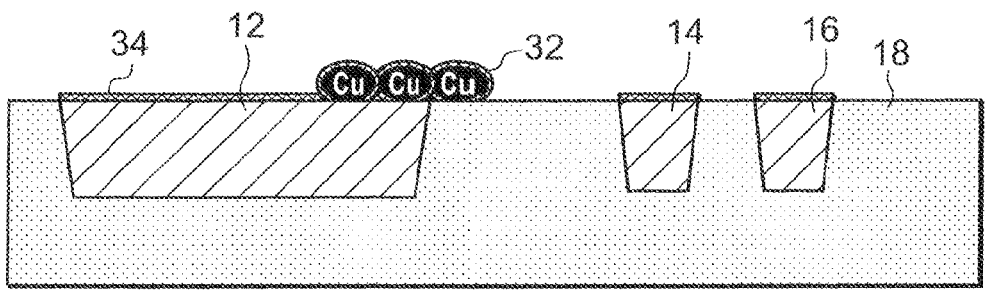

Subsequently, an antioxidant application step as illustrated in FIG. 6A and then a drying step as illustrated in FIG. 6B are performed. Through those steps, an antioxidant film 34 is formed on the surface of the Cu wiring to thereby suppress oxidation of the Cu wiring. The antioxidant applied in FIG. 6A contains an organic residue. Accordingly, at the stage at which the CMP step up to FIG. 6B has been finished, the complex 32 containing Cu and the organic residue is adsorbed on the wiring 12 which is a wide wiring. Note that the method described in JP 2004-193544 A may be used for the antioxidant application step.

Figure 7:
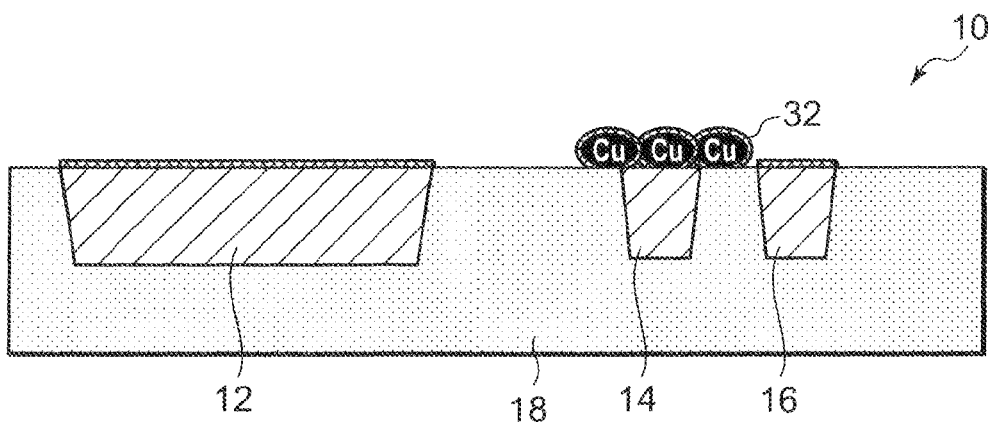
FIG. 7 is a plan view illustrating the semiconductor device according to the embodiment of the present invention.

The complex containing Cu and the organic residue may be adsorbed not only on the wiring 12, which is a wide wiring, but also between the wiring 14 and the wiring 16, which are fine wirings, as illustrated in FIG. 7, for example. In this case, when the wiring 14 and the wiring 16 have different electric potentials, a time-dependent dielectric breakdown (TDDB) lifetime between the wirings is reduced. Alternatively, the complex containing Cu and the organic residue may short-circuit the wiring 14 and the wiring 16 and an operation fault in the semiconductor device is caused, which leads to a yield reduction.

Figure 8:
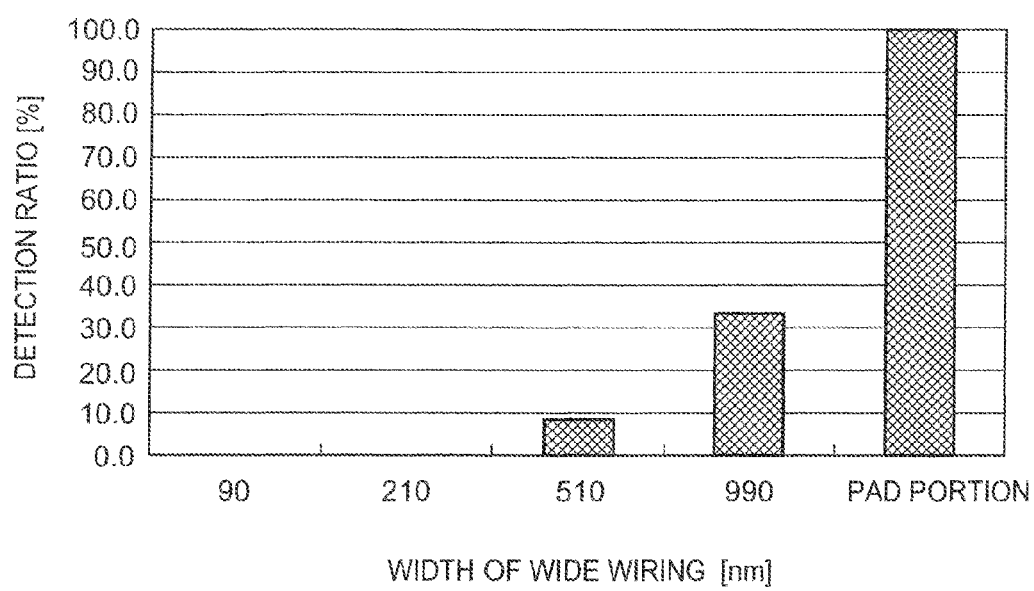
FIG. 8 is a graph illustrating experiment data of a width of a wide wiring and a detection ratio of foreign substances in the embodiment of the present invention.
Figure 9:
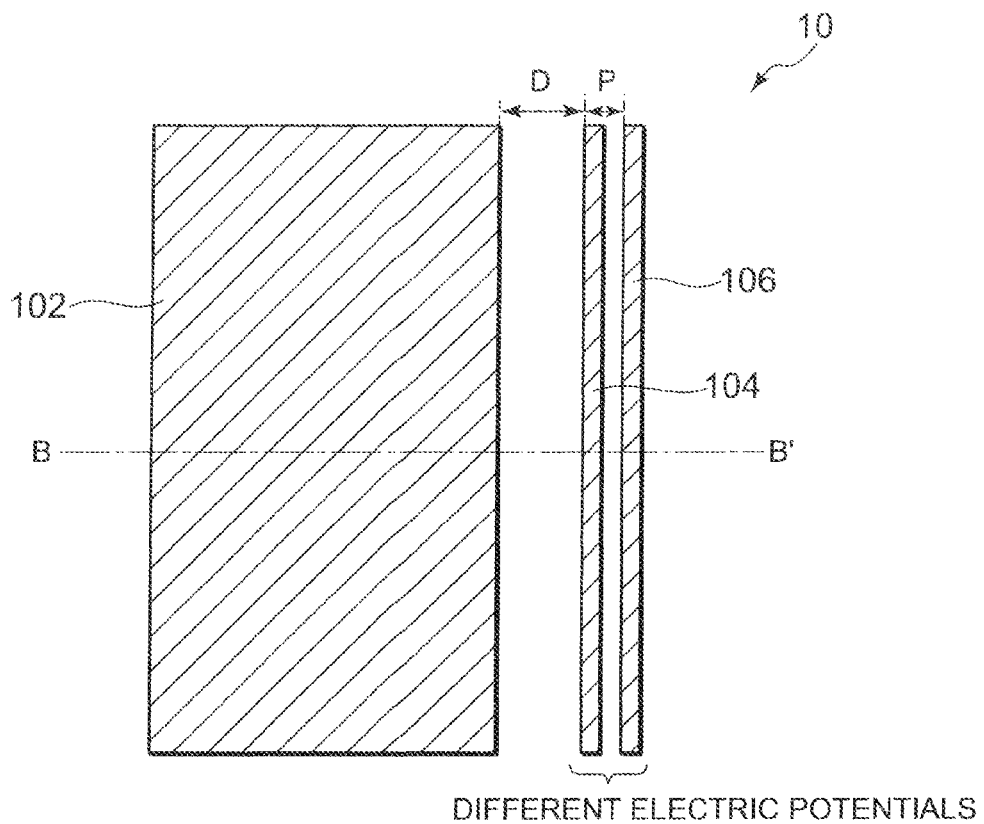
FIG. 9 is a plan view illustrating a conventional semiconductor device.
Figure 10:
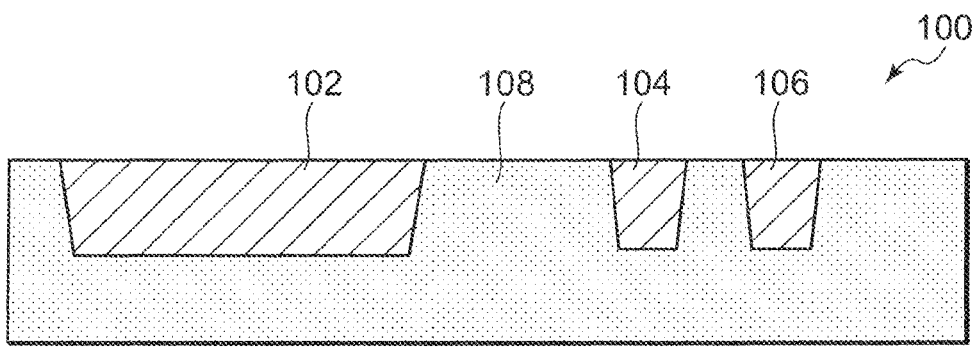
FIG. 10 is a sectional view taken along the line B-B' of FIG. 9.

FIG. 8 illustrates experimental data obtained by determining a width of the wide wiring and a detection ratio of a foreign substance (complex containing Cu and organic residue) in the semiconductor device of this embodiment. The abscissa axis represents a width of the wiring 12 which is the wide wiring, and the ordinate axis represents a detection ratio of the foreign substance. Note that data denoted by "pad portion" in the abscissa axis is a reference of the detection ratio in a case where the wiring width is sufficiently wide. The determination of the detection ratio of the foreign substance (complex containing Cu and organic residue) is performed with the automatic visual inspection device.

As is apparent from FIG. 8, the complex is not detected in wide wirings having a width of 90 nm and 210 nm, whereas the complex is detected in a wide wiring having a width larger than 500 nm. In addition, as the wiring width is increased, the detection ratio becomes higher. Accordingly, it is necessary to structure the wiring 14 and the wiring 16 so as to have the same electric potential in a case where the width of the wiring 12, which is the wide wiring, is equal to or larger than 0.5 μm.

Then, an investigation is conducted as to a distance to which the surface of the wiring layer is contaminated from the wide wiring having the width equal to or larger than 0.5 μm due to the complex containing Cu and the organic residue.

At distances of 0.3 μm, 0.5 μm, 0.7 μm, and 1.4 μm from the wide wiring having the width equal to or larger than 0.5 μm, a Cu concentration is determined by field emission Auger electron spectroscopy (FE-AES). The determination conditions are an accelerating voltage of 20 kV, and a beam diameter of about 50 nmφ.

Results of the determination are as follows:
distance 0.3 μm: 3 atomic %;
distance 0.5 μm: below the detection limit;
distance 0.7 μm: below the detection limit; and
distance 1.4 μm: below the detection limit.
Accordingly, it is necessary to structure the wiring 14 and the wiring 16 so as to have the same electric potential in a case where the wiring 12, which is the wide wiring, and the wiring 14, which is the fine wiring, are arranged with a space less than 0.5 μm therebetween, and where the wiring 12, which is the wide wiring, and the wiring 16, which is the fine wiring, are arranged with a space equal to or smaller than 0.5 μm therebetween.

Further, a size of the foreign substance (complex containing Cu and organic residue) is determined from a scanning electron microscope (SEM) image. As a result, the size of the complex containing Cu and the organic residue ranges from 0.1 to 0.3 μm, and an average thereof is 0.2 μm. Therefore, when the space between the wiring 12, which is the wide wiring, and the wiring 14, which is the fine wiring, is set to be equal to or larger than 0.2 μm, and preferably to be equal to or larger than 0.3 μm, the short-circuit between the wiring 12 and the wiring 14 can be effectively prevented.

Next, a wiring pitch between the wiring 14 and the wiring 16, which are the fine wirings, is described. In FIG. 1, when a region spaced away from the wiring 12 by at least D+2P is present within a region to which the complex containing Cu and the organic residue adheres, it is necessary to impart the same electric potential to the wiring 14 and the wiring 16. As described above, the complex containing Cu and the organic residue is detected in a region away from the wiring 12 of the wide wiring by less than 0.5 μm. Accordingly, when D+2P<0.5 μm and D=0.2 μm (average size of the foreign substance), P<0.15 μm is obtained. Accordingly, in a case where the wiring pitch between the wiring 14 and the wiring 16, which are the fine wirings, is less than 0.15 μm, the wiring 14 and the wiring 16 are necessary to be structured so as to have the same electric potential.

More preferably, in FIG. 1, when a region (D+P) having a distance corresponding to a distance between the wiring 12 and the wiring 16 is present in a region to which the complex containing Cu and the organic residue adheres, the wiring 14 and the wiring 16 are made to have the same electric potential, to thereby improve the TDDB lifetime and the yield of the semiconductor device much more. In this case, when D+P<0.5 μm and D=0.2 μm (average size of foreign substance), P<0.3 μm is obtained. However, in terms of a balance between an integration level and flexibility in wiring design, practically, it is desirable to structure the wiring 14 and the wiring 16 so as to have the same electric potential in a case where the wiring pitch between the wiring 14 and the wiring 16 is less than 0.15 μm. On the other hand, in a case where the wiring pitch between the wiring 14 and the wiring 16 is equal to or larger than 0.15 μm, the wiring pitch does not affect the TDDB lifetime even if the wiring 14 and the wiring 16 have different electric potentials, which has been experimentally confirmed.

The semiconductor device 10 of the present invention is configured to have the same electric potential between the wiring 14 and the wiring 16. With this structure, even in a case where the width of the wiring 12 is equal to or larger than 0.5 μm, the space between the wiring 12 and the wiring 14 is less than 0.5 μm, the space between the wiring 12 and the wiring 16 is equal to or smaller than 0.5 μm, and the wiring pitch between the wiring 14 and the wiring 16 is less than 0.15 μm, which is a case largely affected by the complex containing Cu and the organic residue, there can be obtained an advantageous effect in that the reduction of the TDDB lifetime between the wiring 14 and the wiring 16 and a short-circuit therebetween can be prevented.

Further, the space between the wiring 12, which is the wide wiring, and the wiring 14, which is the fine wiring, is set to be equal to or larger than 0.2 μm, and preferably to be equal to or larger than 0.3 μm, whereby the reduction of the TDDB lifetime between the wiring 12 and the wiring 14 or a short-circuit therebetween can be more effectively prevented.

The semiconductor device according to the present invention is not limited to the above-mentioned embodiment, and various modifications are possible. For example, in the above-mentioned embodiment, the case where the single damascene process is used is exemplified. However, even when a dual damascene process is used, similar effects can be obtained.

Further, in the above-mentioned embodiment, the case where all materials for forming the wirings are made of Cu. However, the material of the wirings is not limited thereto, and a metal material other than a copper containing metal, for example, aluminum (Al) may be used.

What is claimed is:

1. A semiconductor device comprising:
   an interlayer insulating film having a first wiring trench, a second wiring trench adjacent to the first wiring trench in a first direction and a third wiring trench adjacent to the second wiring trench in the first direction;
   a first wiring formed in the first wiring trench having a width, in the first direction, equal to or larger than 0.5 µm;
   a second wiring formed in the second wiring trench arranged with a non-zero space less than 0.5 µm from the first wiring trench; and
   a third wiring formed in the third wiring trench arranged with a non-zero space equal to or smaller than 0.5 µm from the first wiring trench,
   wherein the second wiring and the third wiring are structured to have the same electric potential.

2. The semiconductor device according to claim 1, wherein the first wiring and the second wiring are structured to have different potentials.

3. The semiconductor device according to claim 1, wherein the space between the first wiring and the second wiring is equal to or larger than 0.2 µm.

4. The semiconductor device according to claim 1, wherein the first wiring, the second wiring, and the third wiring are arranged parallel to one another.

5. The semiconductor device according to claim 1, wherein a wiring pitch between the second wiring and the third wiring is less than 0.15 µm.

6. The semiconductor device according to claim 1, wherein the second wiring and the third wiring are formed at a minimum pitch in the semiconductor device.

7. The semiconductor device according to claim 1, wherein the second wiring and the third wiring each have a ground potential or a power supply potential.

8. The semiconductor device according to claim 1, wherein the first wiring, the second wiring, and the third wiring comprise copper containing metal.

9. The semiconductor device according to claim 1, wherein:
   the first wiring, the second wiring, and the third wiring are arranged parallel to one another;
   the space between the first wiring and the second wiring is equal to or larger than 0.2 µm; and
   a wiring pitch between the second wiring and the third wiring is less than 0.15 µm.

10. The semiconductor device according to claim 9, wherein the second wiring and the third wiring each have a ground potential.

11. The semiconductor device according to claim 1, wherein:
    the first wiring, the second wiring, and the third wiring are arranged parallel to one another;
    the space between the first wiring and the second wiring is equal to or larger than 0.2 µm; and
    the second wiring and the third wiring are formed at a minimum pitch.

12. A semiconductor device comprising:
    an interlayer insulating film having a first wiring trench, a second wiring trench adjacent to the first wiring trench in a first direction and a third wiring trench adjacent to the second wiring trench in the first direction;
    a first wiring formed in the first wiring trench having a width, in the first direction, equal to or larger than 0.5 µm;
    a second wiring formed in the second wiring trench; and
    a third wiring formed in the third wiring trench arranged, in the first direction, with a non-zero space equal to or smaller than 0.5 µm from the first wiring trench such that the second wiring trench is arranged, in the first direction, between the first wiring trench and the third wiring trench, wherein the second wiring and the third wiring are structured to have the same electric potential.

13. The semiconductor device according to claim 12, wherein the first wiring and the second wiring are structured to have different potentials.

14. The semiconductor device according to claim 12, wherein the space between the first wiring and the second wiring is equal to or larger than 0.2 µm.

15. The semiconductor device according to claim 12, wherein a wiring pitch between the second wiring and the third wiring is less than 0.15 µm.

* * * * *